United States Patent
Jang et al.

(10) Patent No.: US 8,368,446 B2
(45) Date of Patent: Feb. 5, 2013

(54) DELAY LOCKED LOOP

(75) Inventors: Jae-Min Jang, Gyeonggi-do (KR);
Yong-Ju Kim, Gyeonggi-do (KR);
Hae-Rang Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/190,841

(22) Filed: Jul. 26, 2011

(65) Prior Publication Data
US 2012/0268180 A1 Oct. 25, 2012

(30) Foreign Application Priority Data
Apr. 21, 2011 (KR) .................. 10-2011-0037203

(51) Int. Cl.
*H03L 7/06* (2006.01)
(52) U.S. Cl. ........ 327/158; 327/147; 327/148; 327/149; 327/156; 327/157
(58) Field of Classification Search .......... 327/147–149, 327/156–158
See application file for complete search history.

(56) References Cited

U.S. PATENT DOCUMENTS

| 7,372,339 B2 * | 5/2008 | Fu ..................................... 331/16 |
| 7,692,500 B1 * | 4/2010 | Koukab et al. .................. 331/17 |
| 7,999,584 B2 * | 8/2011 | Rhee et al. ..................... 327/156 |
| 8,115,526 B2 * | 2/2012 | Shiobara ........................ 327/156 |
| 2008/0231324 A1 * | 9/2008 | Liu et al. .......................... 327/12 |
| 2011/0181327 A1 * | 7/2011 | Shiobara ....................... 327/156 |
| 2011/0204944 A1 * | 8/2011 | Lee et al. ...................... 327/159 |
| 2011/0254601 A1 * | 10/2011 | Xiu .................................. 327/157 |
| 2011/0273210 A1 * | 11/2011 | Nagaraj ........................ 327/159 |
| 2011/0291721 A1 * | 12/2011 | Vlasenko et al. ............. 327/158 |
| 2011/0304366 A1 * | 12/2011 | Kanda et al. .................. 327/157 |
| 2012/0176169 A1 * | 7/2012 | Sinha et al. ................... 327/156 |

\* cited by examiner

*Primary Examiner* — Adam Houston
(74) *Attorney, Agent, or Firm* — IP & T Group LLP

(57) ABSTRACT

A delay locked loop includes a delay unit delaying an input clock to generate an output clock, a replica delay unit delaying the output clock to generate a feedback clock, a phase comparing unit outputting a phase signal having a first or second value according to whether the phase of the feedback clock leads the phase of the input clock, a filtering unit generates a filtering signal in response to the phase signal and updates the filtering signal when a difference of count numbers of the phase signal having the first value and the second value is substantially equal to a filtering depth, a locking unit generates a locking signal in response to the filtering signal, and a control unit adjusts a delay value in response to the filtering signal and maintains the delay value when the locking signal is activated.

20 Claims, 7 Drawing Sheets

DELAY LOCKED LOOP

CROSS-REFERENCE TO RELATED APPLICATIONS

The present application claims priority of Korean Patent Application No. 10-2011-0037203, filed on Apr. 21, 2011, which is incorporated herein by reference in its entirety.

BACKGROUND

1. Field

Exemplary embodiments of the present invention relate to a delay locked loop (DLL) for use in a semiconductor device.

2. Description of the Related Art

Circuit elements, such as double data rate synchronous DRAM (DDR SDRAM), transmit various signals and data using an internal clock synchronized with an external clock used in an external system. Although a clock inputted to circuit elements is applied in synchronization with an external clock, it may be delayed while passing through elements inside a device, and thus, it may not be outputted to the outside of the device in synchronization with the external clock. To transmit signals and data stably, the internal clock and the external clock should be more exactly synchronized with the external system by reversely compensating the internal clock for a time delay taken to load data onto a bus within the circuit elements, and so on. To this end, a delay locked loop (DLL) may be used in the circuit elements.

FIG. 1 is a block diagram of a conventional DLL.

Referring to FIG. 1, the DLL includes a delay unit 110, a replica delay unit 120, a phase comparing unit 130, a locking unit 140, and a control unit 150.

The delay unit 110 delays an input clock ICLK to generate an output clock OCLK. The replica delay unit 120 has modeled delay values for reflecting a signal delay caused by elements inside a system to which the DLL is applied, and delays the output clock OCLK to generate a feedback clock FBCLK. The phase comparing unit 130 compares a phase of the input clock ICLK with a phase of the feedback clock FBCLK to output a phase comparing result OUT. The control unit 150 increases or decreases a delay value of the delay unit 110 according to the phase comparing result OUT of the phase comparing unit 130. The delay value of the delay unit 110 may be incrementally changed by a unit delay value. When the phase comparing result OUT of the phase comparing unit 130 indicates that the input clock ICLK is synchronized with the feedback clock FBCLK, the locking unit 140 activates a locking signal LOCK that allows the delay unit 110 to maintain a certain delay value at which the input clock ICLK and the feedback clock FBCLK are synchronized.

For reference, the synchronization of the input clock ICLK and the feedback clock FBCLK means that the phases of the two clocks ICLK and FBCLK become equal to each other or the phase difference between the two clocks ICLK and FBCLK become smaller than that caused by the unit delay value.

In general, when the phase of the feedback clock FBCLK leads the phase of the input clock ICLK, the phase comparing result OUT of the phase comparing unit 130 may become a logic low level. In an opposite case, the phase comparing result OUT may become a logic high level. Therefore, when the phase comparing result OUT is a logic low level, the control unit 150 increases the delay value of the delay unit 110 by the unit delay value. Meanwhile, when the phase comparing result OUT is a logic high level, the control unit 150 decreases the delay value of the delay unit 110 by the unit delay value.

Therefore, if the phase comparing result OUT of the phase comparing unit 130 changes from a logic low level to a logic high level because the delay value of the delay unit 110 is increased by the unit delay value, or if the phase comparing result OUT of the phase comparing unit 130 changes from a logic high level to a logic low level because the delay value of the delay unit 110 is decreased by the unit delay value, the phase difference between the input clock ICLK and the feedback clock FBCLK may be smaller than that caused by the unit delay value. That is, in this case, the input clock ICLK and the feedback clock FBCLK are synchronized with each other and therefore the locking unit 140 activates the locking signal LOCK.

However, due to power noise or the like, noise may occur in the phase comparing result OUT. That is, assuming that noise occurs in the phase comparing result OUT, the phase comparing result OUT, which should be maintained at a logic low level, may change to a logic high level. For example, the phase comparing result OUT, which should be maintained as 'LLLLLL', may become 'LLLHLL' clue to noise. In this case, since the locking unit 140 activates the locking signal LOCK, the phase of the feedback clock FBCLK may be undesirably locked, thus causing a malfunction in the device.

SUMMARY

Exemplary embodiments of the present invention are directed to a DLL which is capable of enhancing the reliability of a DLL operation.

In accordance with an exemplary embodiment of the present invention, a delay locked loop includes a delay unit configured to delay an input clock to generate an output clock, a replica delay unit configured to delay the output clock to generate a feedback clock, a phase comparing unit configured to output a phase signal having a first value when a phase of the feedback clock leads a phase of the input clock and having a second value when the phase of the feedback clock lags behind the phase of the input clock, a filtering unit configured to generate a filtering signal in response to the phase signal and update the filtering signal when a difference between a count number of the phase signal having the first value and a count number of the phase signal having the second value is substantially equal to a filtering depth, a locking unit configured to generate a locking signal in response to the filtering signal, and a control unit configured to adjust a delay value of the delay unit in response to the filtering signal and maintain the delay value of the delay unit when the locking signal is activated.

In accordance with another exemplary embodiment of the present invention, a delay locked loop includes a delay unit configured to delay an input clock to generate an output clock, a replica delay unit configured to delay the output clock to generate a feedback clock, a phase comparing unit configured to output a phase signal having a first value when a phase of the feedback clock leads a phase of the input clock and having a second value when the phase of the feedback clock lags behind the phase of the input clock, a filtering unit configured to generate a filtering signal in response to the phase signal and update the filtering signal when a difference between a count number of the phase signal having the first value and a count number of the phase signal having the second value is substantially equal to a filtering depth, a locking unit configured to generate a locking signal in response to the filtering signal by using different methods in a high speed mode and a low speed mode, and a control unit configured to adjust a delay value of the delay unit in response to the filtering signal and maintain the delay value of the delay unit when the locking signal is activated.

In accordance with yet another exemplary embodiment of the present invention, a delay locked loop includes a delay unit configured to delay an input clock to generate an output clock, a replica delay unit configured to delay the output clock to generate a feedback clock, a feedback delay unit configured to delay the feedback clock and generate a feedback delay clock, a phase comparing unit configured to output a phase signal having a first value when a phase of a feedback delay clock leads a phase of the input clock and having a second value when the phase of the feedback delay clock lags behind the phase of the input clock, a filtering unit configured to filter the phase signal to generate a filtering signal, a locking unit configured to generate a locking signal in response to the filtering signal, and a control unit configured to adjust a delay value of the delay unit in response to the filtering signal, and maintain the delay value of the delay unit when the locking signal is activated.

In accordance with still another exemplary embodiment of the present invention, a delay locked loop includes a delay unit configured to delay an input clock to generate an output clock, a replica delay unit configured to delay the output clock to generate a feedback clock, a feedback delay unit configured to delay the feedback clock and generate a feedback delay clock, a phase comparing unit configured to output a phase signal having a first value when a phase of a feedback delay clock leads a phase of the input clock and having a second value when the phase of the feedback delay clock lags behind the phase of the input clock, a filtering unit configured to filter the phase signal to generate a filtering signal, a locking unit configured to generate a locking signal in response to the filtering signal by using different methods in a high speed mode and a low speed mode, and a control unit configured to adjust a delay value of the delay unit in response to the filtering signal, and maintain the delay value of the delay unit when the locking signal is activated.

In accordance with further another exemplary embodiment of the present invention, a delay locked loop includes a delay unit configured to delay an input clock to generate an output clock, a replica delay unit configured to delay the output clock to generate a feedback clock, a phase comparing unit configured to output a phase signal having a first value when a phase of the feedback clock leads a phase of the input clock and having a second value when the phase of the feedback clock lags behind the phase of the input clock, a locking unit configured to generate a locking signal in response to the phase signal by using different methods in a high speed mode and a low speed mode, and a control unit configured to adjust a delay value of the delay unit in response to the phase signal, and maintain the delay value of the delay unit when the locking signal is activated.

DETAILED DESCRIPTION

Figure 1:
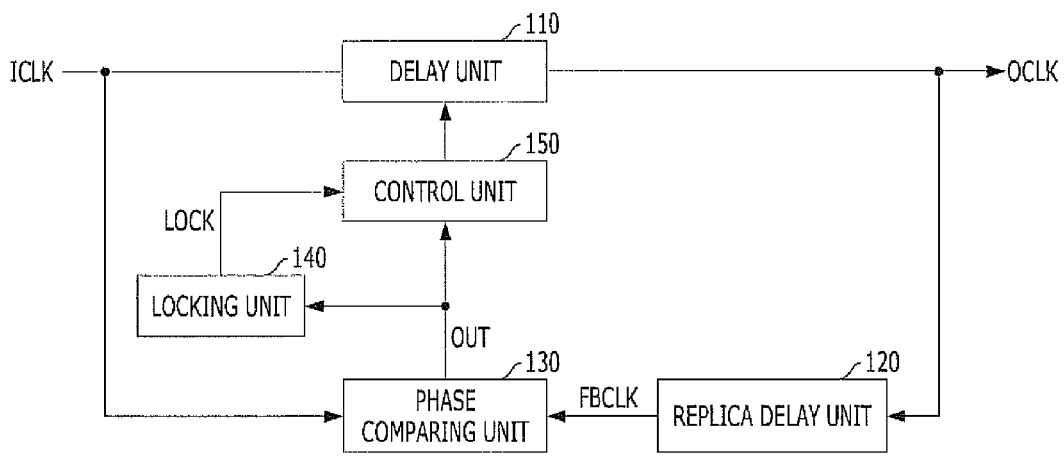
FIG. 1 is a block diagram of a conventional DLL.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

Figure 2:
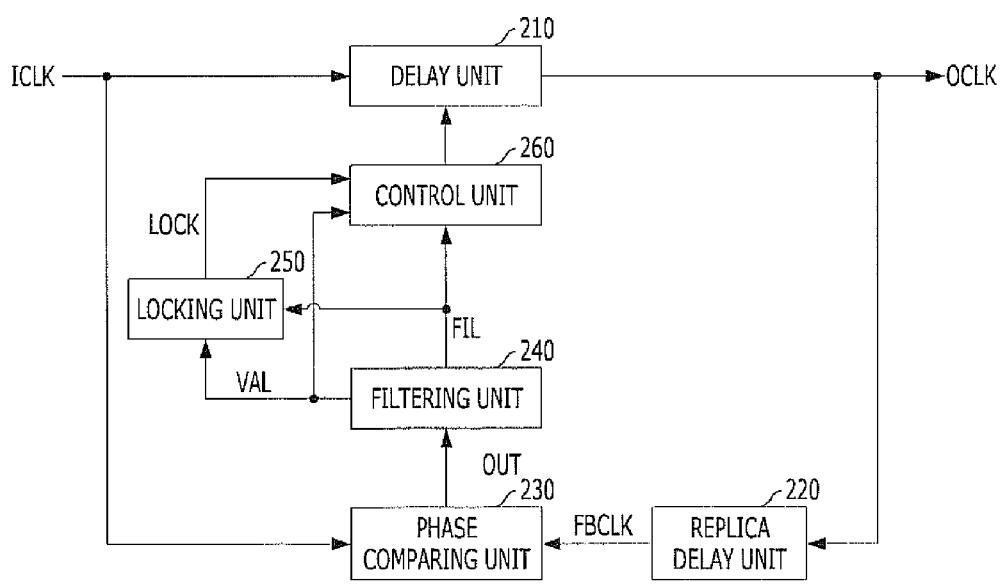
FIG. 2 is a block diagram of a DLL in accordance with an exemplary embodiment of the present invention.

FIG. 2 is a block diagram of a DLL in accordance with an exemplary embodiment of the present invention.

Referring to FIG. 2, the DLL includes a delay unit 210, a replica delay unit 220, a phase comparing unit 230, a filtering unit 240, a locking unit 250, and a control unit 260. The delay unit 210 delays an input clock ICLK to generate an output clock OCLK. The replica delay unit 220 delays the output clock OCLK to generate a feedback clock FBCLK. The phase comparing unit 230 outputs a phase signal OUT having a first value when a phase of the feedback clock FBCLK leads a phase of the input clock ICLK and having a second value when the phase of the feedback clock FBCLK lags behind the phase of the input clock ICLK. The filtering unit 240 generates a filtering signal FIL in response to the phase signal OUT, and updates the filtering signal FIL when a difference between a count number of the phase signal OUT having the first value and a count number of the phase signal OUT having the second value is substantially equal to a filtering depth. The locking unit 250 generates a locking signal LOCK in response to the filtering signal FIL. The control unit 260 adjusts a delay value of the delay unit 210 in response to the filtering signal FIL and maintains the delay value of the delay unit 210 when the locking signal LOCK is activated.

Hereinafter, an operation of the DLL will be described with reference to FIG. 2.

The delay unit 210 delays the input clock ICLK to generate the output clock OCLK. The delay value of the delay unit 210 is adjusted by the control unit 260. In general, the delay value of the delay unit 210 may be gradually increased from a minimum value by the control unit 260.

The replica delay unit 220 delays the output clock OCLK to generate the feedback clock FBCLK. The replica delay unit 220 has modeled delay values of delay elements through which the output clock OCLK is to pass within a chip (e.g., a semiconductor memory system).

The phase comparing unit 230 compares the phase of the input clock ICLK with the phase of the feedback clock FBCLK and generates the phase signal OUT. The phase signal OUT has a first value when the phase of the feedback clock FBCLK leads the phase of the input clock ICLK, and has a second value when the phase of the feedback clock FBCLK lags behind the phase of the input clock ICLK. The first value may be a logic low level L and the second value may be a logic high level H.

The filtering unit 240 generates the filtering signal FIL in response to the phase signal OUT, and updates the filtering signal FIL when the difference between the count number of the 'L' phase signal OUT and the count number of the 'H' phase signal OUT is substantially equal to the filtering depth. The filtering unit 240 updates the filtering signal FIL and activates a validity signal VAL indicating that the filtering signal FIL is updated.

The following description will be given on a case in which the filtering signal FIL is updated with 'L' if the count number of the 'L' phase signal OUT minus the count number of the 'H' phase signal OUT equals the filtering depth, and the filtering signal FIL is updated with 'H' if the count number of the 'H' phase signal OUT minus the count number of the 'L' phase signal OUT equals the filtering depth.

The control unit 260 adjusts the delay value of the delay unit 210 in response to the filtering signal FIL whenever the validity signal VAL is activated. When the validity signal VAL is activated and the filtering signal FIL is a logic low level L, in which, for example, the phase of the feedback clock FBCLK leads the phase of the input clock ICLK, the control unit 260 increases the delay value of the delay unit 210. On the other hand, when the validity signal VAL is activated and the filtering signal FIL is a logic high level H, in which, for example, the phase of the feedback clock FBCLK lags behind the phase of the input clock ICLK, the control unit 260 decreases the delay value of the delay unit 210. In addition, the control unit 260 maintains the delay value of the delay unit 210 from the point of time when the locking signal LOCK is activated.

The locking unit 250 is enabled in response to the validity signal VAL and activates the locking signal LOCK when the input clock ICLK and the feedback clock FBCLK are synchronized with each other.

The following methods may be used to activate the locking signal LOCK.

(1) Method of activating the locking signal LOCK when the value of the filtering signal FIL is changed (hereinafter, referred to as a first method).

The first method activates the locking signal LOCK when the filtering signal FIL changes from 'L' to 'H' or changes from 'H' to 'L'. The filtering signal FIL changes from 'L' to 'H', when, for example, the delay value of the delay unit 210 is increased, or changes from 'H' to 'L', when, for example, the delay value of the delay unit 210 is decreased. The change represents that the input clock ICLK and the feedback clock FBCLK are synchronized with each other.

(2) Method of activating the locking signal LOCK when the filtering signal FIL maintains the same value two or more times and then its value is changed (hereinafter, referred to as a second method).

The second method activates the locking signal LOCK when the filtering signal FIL maintains the 'L' value two or more times and then changes to 'H', or the filtering signal FIL maintains the 'H' value two or more times and then changes to 'L'. For the sake of convenience, the case in which the locking signal LOCK is activated when the filtering signal FIL maintains the same value two or more times and then changes its value, will be described hereinafter. The locking unit 250 stores the filtering signal FIL, for example, two or more times whenever the validity signal VAL is activated. Using the stored value, the locking signal LOCK is activated when the value of the filtering signal FIL becomes 'L L H' (the delay value of the delay unit 210 is increased) or becomes 'H H L' (the delay value of the delay unit 210 is decreased).

As compared to the conventional art, the DLL in accordance with the exemplary embodiment of the present invention increases the reliability of the locking operation because the filtering unit 240 removes noise from the phase signal OUT. However, if power noise continuously occurs so that noise also occurs in the filtering signal FIL, a malfunction may occur in the locking operation even using the first method. In the case of the second method, the locking signal LOCK is activated when the filtering signal FIL maintains the same value and then changes its value. Hence, the occurrence of such a malfunction may be reduced. That is, the second method may have higher reliability in the locking operation than the first method.

Figure 3:
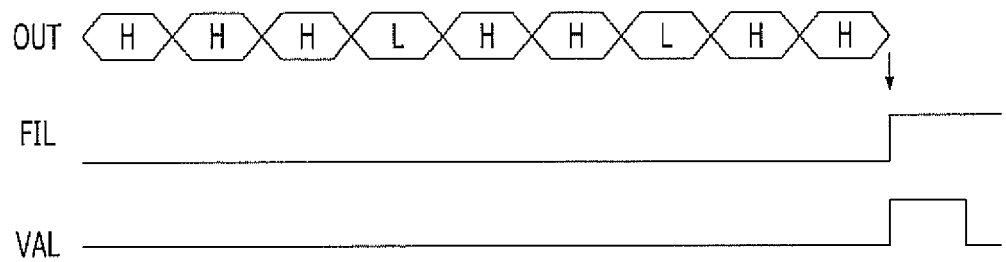
FIG. 3 is a waveform diagram illustrating an operation of a filtering unit shown in FIG. 2.
Figure 3:
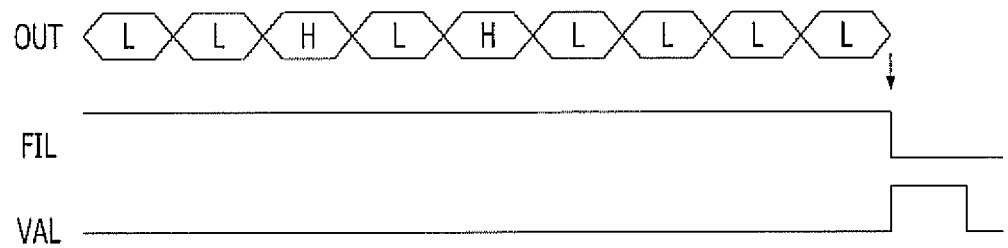

FIG. 3 is a waveform diagram explaining the operation of the filtering unit 240 shown in FIG. 2.

The filtering unit 240 corresponds to a filter circuit for removing noise that may occur in the phase signal OUT. In particular, as described above, the filter, which updates the output signal when the difference between the count number of the input signals having the 'L' level (as a first value) and the count number of the input signals having the 'H' level (as a second value) is equal to the filtering depth, is called a moving average filter.

Hereinafter, the operation of the filtering unit 240 acting as the moving average filter will be described with reference to FIG. 3 (the case in which the filtering depth is, e.g., 5). In this case, the phase signal OUT corresponds to the input signal of the moving average filter, and the filtering signal FIL corresponds to the output signal of the moving average filter.

The waveform diagram illustrated in the upper part of FIG. 3 represents the case in which the count number of the 'H' phase signal OUT minus the count number of the 'L' phase signal OUT equals filtering depth. As illustrated in FIG. 3, when the phase signal OUT is inputted with 'H H H L H H L H H', the filtering signal FIL is updated with 'H' and the validity signal VAL representing that the filtering signal FIL has been updated is activated.

The waveform diagram illustrated in the lower part of FIG. 3 represents the case in which the count number of the 'L' phase signal OUT minus the count number of the 'H' phase signal OUT equals filtering depth. As illustrated in FIG. 3, when the phase signal OUT is inputted with 'L L H L H L L L L', the filtering signal FIL is updated with 'L' and the validity signal VAL representing that the filtering signal FIL has been updated is activated.

If the moving average filter instead of a general low pass filter is used in the DLL, the filtering depth may be increased and the output signal may be quickly updated. The low pass filter updates the output signal when the same value is inputted successively. In this case, the output signal may not be desirably updated even though the filtering depth is slightly increased.

For example, it is assumed that the current output of the low pass filter having the filtering depth of 5 is 'H' and 'L L L L H L L L L H L L L L' is inputted to the low pass filter. If 'H' is noise, 'H' should be removed by the low pass filter and the output of the low pass filter should change from 'H' to 'L'. However, since 'L' is not successively inputted five times, the output of the low pass filter does not change to 'L'. On the other hand, in the case of the moving average filter, the output changes from to 'L' from the point of time when 'L L L L H L L' is inputted.

Figure 4A:
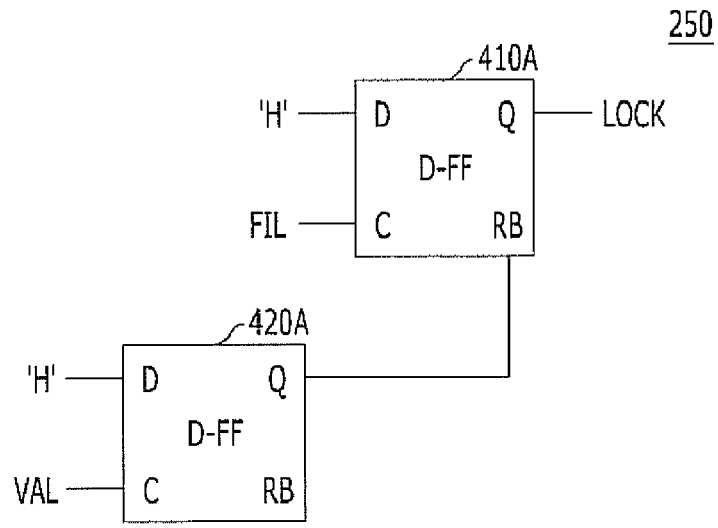
FIGS. 4A and 4B are block diagrams of a locking unit shown in FIG. 2.
Figure 4B:
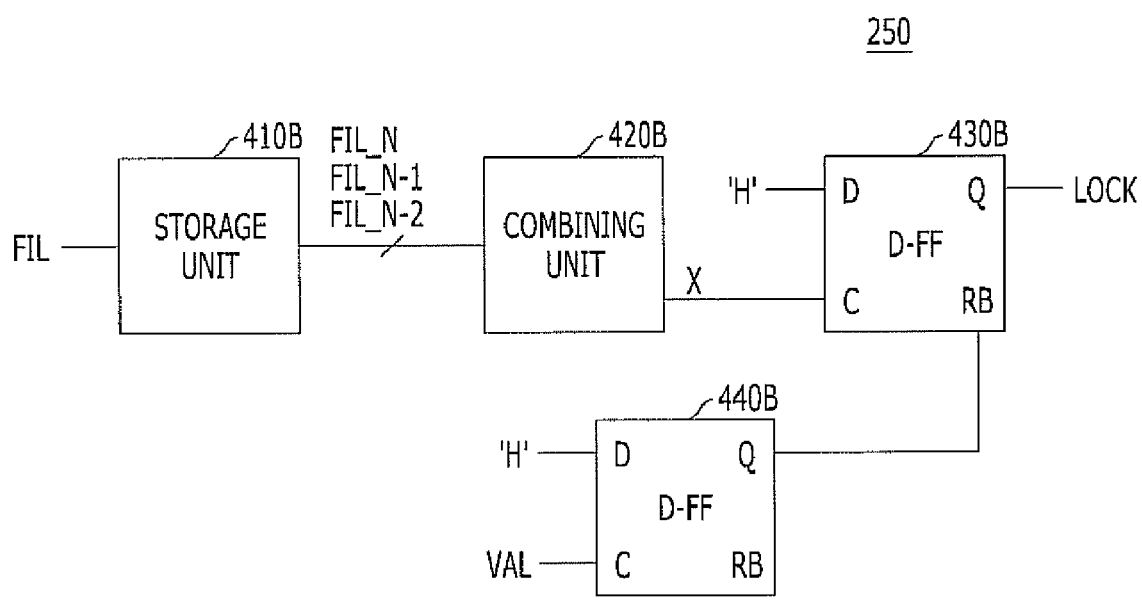

FIGS. 4A and 4B are block diagrams of the locking unit 250 of FIG. 2.

FIG. 4A is a block diagram of the locking unit 250 using the first method explained with reference to FIG. 2, and FIG. 4B is a block diagram of the locking unit 250 using the second method explained with reference to FIG. 2.

Referring to FIG. 4A, the locking unit 250 includes two D flip-flops 410A and 420A. 'H' is inputted to the input terminals D of the D flip-flops 410A and 420A. When the reset terminal RB is activated, the values stored in the D flip-flops 410A and 420A and the outputs Q of the D flip-flops 410A and 420A are reset to 'L'. For reference, since the reset terminal RB of the D flip-flop 420A is used only to reset the DLL, it is not illustrated in FIG. 2. The D flip-flops 410A and 420A store signals inputted to the input terminals D when the enable terminals C are activated, and output the stored signals through the output terminals Q.

The outputs Q of the D flip-flops 410A and 420A are in a reset state of a logic low level 'L'. Since the output Q of the D flip-flop 420A is inputted to the reset terminal RB of the D flip-flop 410A, the D flip-flop 410A maintains a reset state, that is, a state in which the output Q has a 'L' value when the output Q of the D flip-flop 420A is 'L'. In this case, the output Q of the D flip-flop 410A corresponds to the locking signal LOCK. If the filtering signal FIL changes from 'L' to 'H', the validity signal VAL is activated. If the validity signal VAL is activated, the D flip-flop 420A stores and outputs 'H'. If the output Q of the D flip-flop 420A changes to 'H', the reset terminal RB of the D flip-flop 410A is deactivated. Since the filtering signal FIL inputted to the enable terminal C of the D flip-flop 410A becomes 'H', the D flip-flop 410A stores and outputs 'H' inputted to the input terminal D. Therefore, the locking signal LOCK is activated to 'H'.

FIG. 4A illustrates a configuration of activating the locking signal LOCK when the filtering signal FIL changes from 'L' to 'H'. For the sake of convenience, since the configuration of activating the locking signal LOCK when the filtering signal FIL changes from 'H' to 'L' can be derived from the configuration of FIG. 4A, its detailed description will be omitted.

Referring to FIG. 4B, the locking unit 250 includes a storage unit 410B, a combining unit 420B, and two D flip-flops 430B and 440B. The operation of the D flip-flops 430B and 440B is substantially identical to that explained with reference to FIG. 4A, except for the signal inputted to the enable terminal C of the D flip-flop 430B corresponding to the D flip-flop 410A.

The storage unit 410B stores the value of the filtering signal FIL whenever the validity signal VAL is activated, and outputs the stored value. FIL_N represents the value of the filtering signal FIL inputted when the current validity signal VAL is activated. FIL_N−1 and FIL_N−2 represent the values of the filtering signal FIL inputted at a first time and a second time, respectively, before the current validity signal VAL.

The combining unit receives the values FIL_N−2, FIL_N−1 and FIL_N and generates a combination signal X. When the values FIL_N−2, FIL_N−1 and FIL_N are L, L, and H, respectively, the combination signal X is activated to 'H'. Therefore, if the values FIL_N−2, FIL_N−1 and FIL_N are L, L, and H when the validity signal VAL is activated, the D flip-flop 430B stores and outputs 'H' inputted to the input terminal D. Thus, the locking signal LOCK is activated to 'H'.

FIG. 4B illustrates a configuration of activating the locking signal LOCK when the filtering signal FIL maintains 'L' two times and then changes to 'H'. For the sake of convenience, since the configuration of activating the locking signal LOCK when the filtering signal FIL maintains 'H' two times and then changes to 'L' can be derived from the configuration of FIG. 4B, its detailed description will be omitted.

Figure 5:
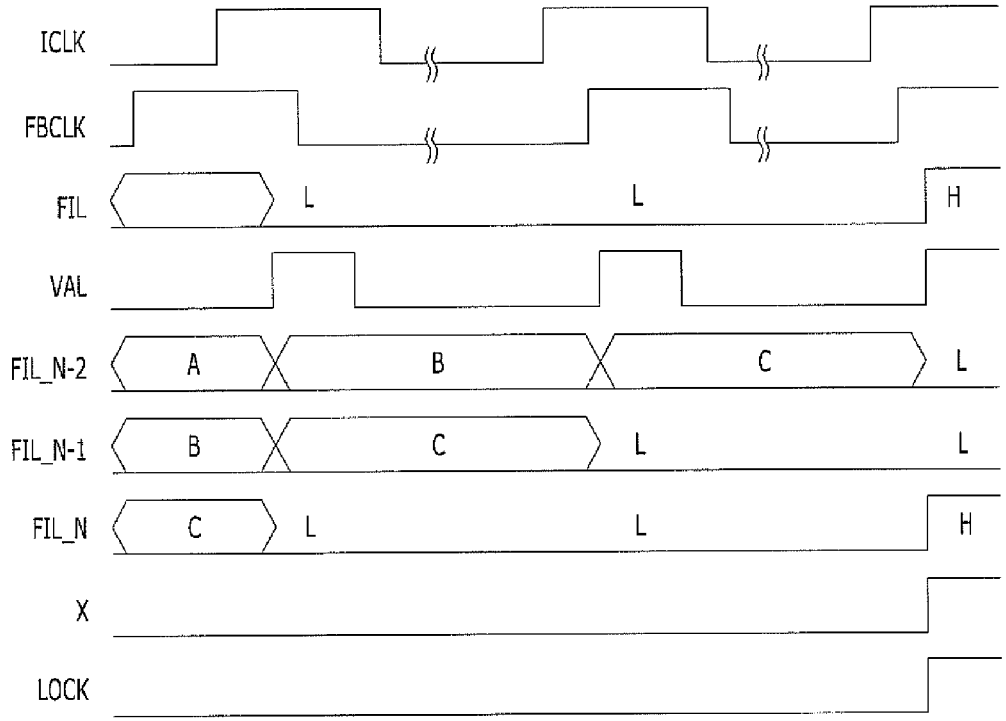
FIG. 5 is a waveform diagram illustrating an operation of the locking unit shown in FIG. 4B.

FIG. 5 is a waveform diagram illustrating an operation of the locking unit 250 shown in FIG. 4B.

In FIG. 5, the filtering signal FIL is updated by comparing a phase of the input clock ICLK with a phase of the feedback clock FBCLK, and the validity signal VAL is activated whenever the filtering signal FIL is updated. If the filtering signal FIL maintains the same value two times (FIL_N−2='L', FIL_N−1='L') and changes to FIL_N='H', it means that the input clock ICLK and the feedback clock FBCLK are synchronized with each other, as illustrated in FIG. 5. Thus, the locking unit 250 shown in FIG. 4B activates the locking signal LOCK.

Figure 6:
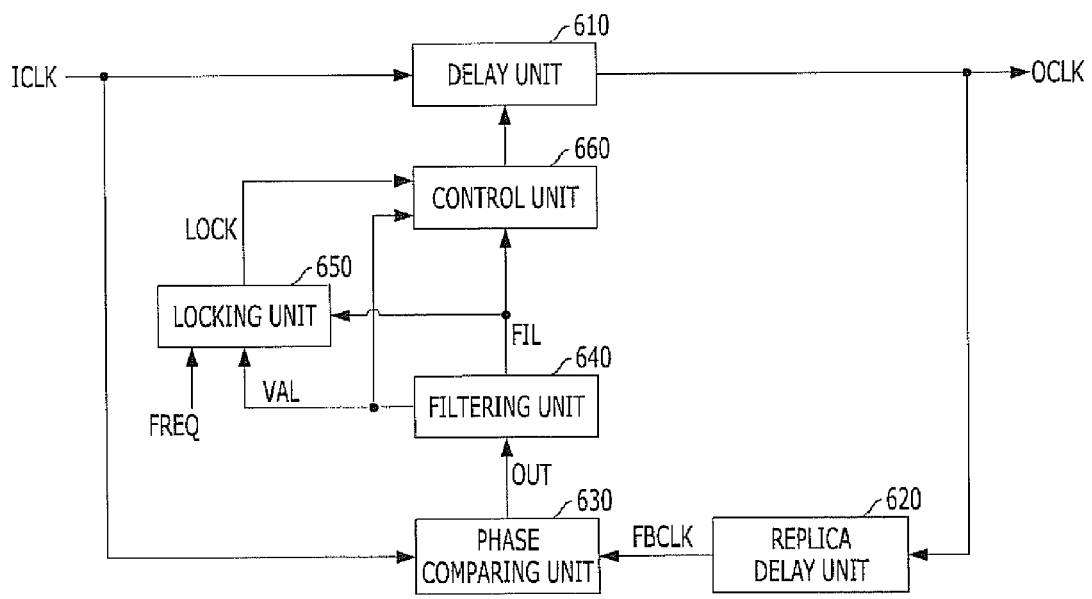
FIG. 6 is a block diagram of a DLL in accordance with another exemplary embodiment of the present invention.

FIG. 6 is a block diagram of a DLL in accordance with another exemplary embodiment of the present invention.

The DLL shown in FIG. 6 increases the reliability of the DLL operation by performing the DLL operation differently according to a frequency of the input clock ICLK. In this case, the DLL operation is performed using the first method and the second method explained with reference to FIG. 2.

Referring to FIG. 6, the DLL includes a delay unit 610, a replica delay unit 620, a phase comparing unit 630, a filtering unit 640, a locking unit 650, and a control unit 660.

The delay unit 610 delays an input clock ICLK to generate an output clock OCLK. The replica delay unit 620 delays the output clock OCLK to generate a feedback clock FBCLK. The phase comparing unit 630 outputs a phase signal OUT having a first value when the phase of the feedback clock FBCLK leads the phase of the input clock ICLK and having a second value when the phase of the feedback clock FBCLK lags behind the phase of the input clock ICLK. The filtering unit 640 generates a filtering signal FIL in response to the phase signal OUT and updates the phase signal OUT when the difference between the count number of the phase signal OUT having the first value and the count number of the phase signal OUT having the second value is substantially equal to a filtering depth. The locking unit 650 generates a locking signal LOCK in response to the filtering signal FIL. Specifically, the locking unit 650 generates the locking signal LOCK using different methods in a high speed mode and a low speed mode, respectively. The control unit 660 adjusts the delay value of the delay unit 610 in response to the filtering signal FIL and maintains the delay value of the delay unit 610 when the locking signal LOCK is activated.

Hereinafter, an operation of the DLL will be described with reference to FIG. 6.

The operation of the DLL of FIG. 6, except the locking unit 650, is substantially identical to that explained hereinbefore with reference to FIG. 2. Therefore, the operation of the DLL of FIG. 6 will be described focusing on the locking unit 650.

The locking unit 650 performs the DLL operation using different methods in a high speed mode and a low speed mode. The high speed mode is an operation mode in which the frequency of the input clock ICLK is relatively high, and the low speed mode is an operation mode in which the frequency of the input clock ICLK is relatively low. A frequency signal FREQ is activated in the high speed mode and is deactivated in the low speed mode, depending on the frequency of the input clock ICLK. If the DLL is used for a memory device, the frequency signal FREQ may be generated using CAS Write Latency (CWL) information. This is because the CWL may be set to be larger as a frequency of a clock signal used in the memory signal increases, and it may be set to be smaller as the frequency of the clock signal decreases.

The locking unit 650 is enabled in response to the validity signal VAL. In the high speed mode (the frequency signal FREQ is activated), the locking unit 650 activates the locking signal LOCK when the value of the filtering signal FIL changes. In the low speed mode, the locking unit 650 activates the locking signal LOCK when the filtering signal FIL maintains the same value two or more times and then changes its value. That is, the locking unit 650 activates the locking signal LOCK in the high speed mode by using the first method of FIG. 2, and activates the locking signal LOCK in the low speed mode by using the second method of FIG. 2.

The reason why the second method is used in the low speed mode is identical to that explained with reference to FIG. 2. The reason why the first method is used in the high speed mode is identical to that explained with reference to FIG. 2. If the frequency of the input clock ICLK is increased, the activation duration (H duration) and the deactivation duration (L duration) of the input clock ICLK are reduced. Therefore, even though the delay value of the feedback clock FBCLK slightly changes, the phase relationship between the input clock ICLK and the feedback clock FBCLK changes, and thus, the filtering signal FIL cannot maintain the same value two or more times. Consequently, when the frequency of the input clock ICLK is high, the DLL operation may be desirably performed using the second method.

Therefore, in the high speed mode, the first method may be used to perform the DLL operation in order to obtain a desirable DLL operation. In the low speed mode, the second method may be used to perform the DLL operation in order to increase the reliability of the DLL operation. That is, the DLL shown in FIG. 6 may employ benefits of both the first method and the second method.

Figure 7:
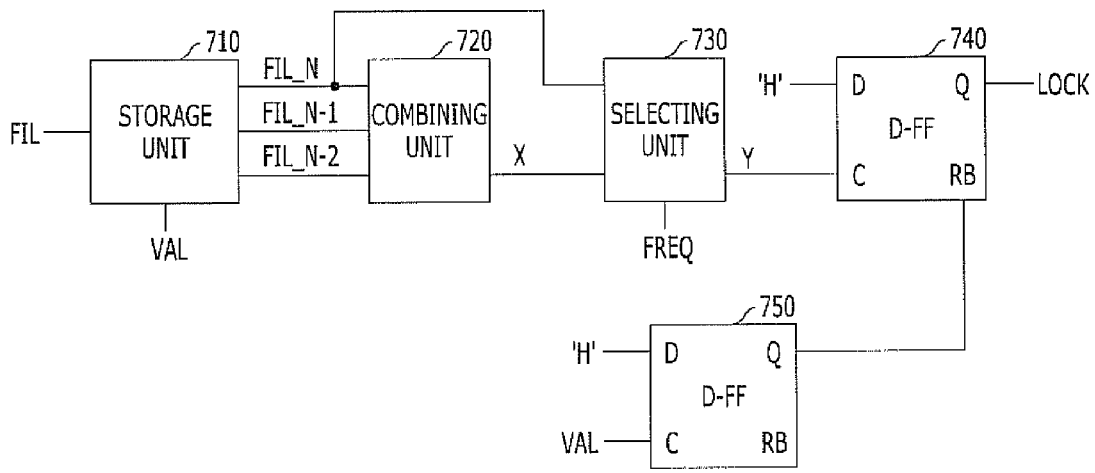
FIG. 7 is a circuit diagram of a locking unit shown in FIG. 6.

FIG. 7 is a circuit diagram of the locking unit 650 shown in FIG. 6.

The locking unit 650 includes a storage unit 710, a combining unit 720, a selecting unit 730, and two D flip-flops 740 and 750. The description about the flip-flops 740 and 750 is substantially identical to those of FIGS. 4A and 4B. The operation of the locking unit 650 will be described based on two cases: the first case in which the frequency signal FREQ is activated, and the second case in which the frequency signal FREQ is deactivated.

(1) Case in which the frequency signal FREQ is activated in the high speed mode.

Since the selecting unit 730 selects FIL_N as its output Y, FIN_N is inputted to the enable terminal C of the D flip-flop 740. As described hereinbefore with reference to FIG. 4A, FIL_N represents the value of the filtering signal FIL inputted when the validity signal VAL is activated. It may be considered that FIL_N is equal to the filtering signal FIL.

The operation of the D flip-flops 740 and 750 is substantially identical to that explained hereinbefore with reference to FIG. 4A. In addition, FIL_N is substantially identical to the filtering signal FIL. Thus, if the frequency signal FREQ is activated, the locking signal LOCK is activated when the filtering signal FIL changes from 'L' to 'H' (It is substantially identical to the operation of FIG. 4A).

(2) Case in which the frequency signal FREQ is deactivated in the low speed mode.

Since the selecting unit 730 selects a combination signal X outputted from the combining unit 720 as its output Y, the combination signal X is inputted to the enable terminal C of the D flip-flop 740. As described above with reference to FIG. 4B, the combination signal X is activated when FIL_N−2, FIL_N−1, and FIL_N are L, L, and H, respectively.

The operation of the D flip-flops 740 and 750 and the activation of the combination signal X are substantially identical to those explained above with reference to FIG. 4B. Therefore, when the frequency signal FREQ is deactivated, the locking signal LOCK is activated when FIL_N−2, FIL_N−1, and FIL_N are L, L, and H, respectively (It is substantially identical to the operation of FIG. 4B).

FIG. 7 illustrates a diagram of activating the locking signal LOCK when the filtering signal FIL changes from 'L' to 'H' (high speed mode) or the filtering signal FIL maintains 'L' two times and then changes to 'H' (low speed mode). Since the configuration of activating the locking signal LOCK when the filtering signal FIL changes from 'H' to 'L' (high speed mode) or the filtering signal FIL maintains 'H' two times and then changes to 'L' (low speed mode) can be derived from FIG. 7, for the sake of convenience, its detailed description will be omitted.

Figure 8:
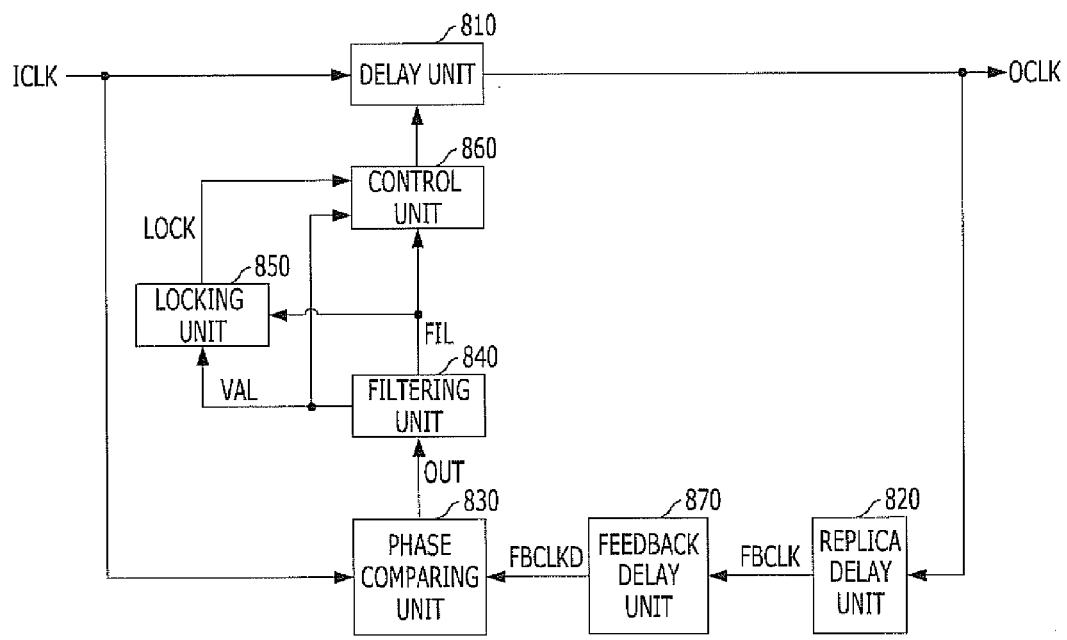
FIG. 8 is a block diagram of a DLL in accordance with yet another exemplary embodiment of the present invention.

FIG. 8 is a block diagram of a DLL in accordance with yet another exemplary embodiment of the present invention.

The DLL shown in FIG. 8 performs a DLL operation using an input clock ICLK and a feedback delay clock FBCLKD generated by delaying a feedback clock FBCLK.

Referring to FIG. 8, the DLL includes a delay unit 810, a replica delay unit 820, a phase comparing unit 830, a filtering unit 840, a locking unit 850, and a control unit 860. The delay unit 810 delays an input clock ICLK to generate an output clock OCLK. The replica delay unit 820 delays the output clock OCLK to generate a feedback clock FBCLK. The phase comparing unit 830 outputs a phase signal OUT having a first value when the phase of the feedback delay clock FBCLKD generated by delaying the feedback clock FBCLK leads the phase of the input clock ICLK and having a second value when the phase of the feedback delay clock FBCLKD lags behind the phase of the input clock ICLK. The filtering unit 840 filters the phase signal OUT to generate a filtering signal FIL. The locking unit 850 generates a locking signal LOCK in response to the filtering signal FIL. The control unit 860 adjusts the delay value of the delay unit 810 in response to the filtering signal FIL and maintains the delay value of the delay unit 810 when the locking signal LOCK is activated.

Hereinafter, an operation of the DLL will be described with reference to FIG. 8.

The operation of the DLL shown in of FIG. 8, except the locking unit 850 and the feedback delay unit 870, is substantially identical to that explained above with reference to FIG. 2. Therefore, the operation of the DLL shown in FIG. 8 will be described focusing on the locking unit 850 and the feedback delay unit 870.

That the filtering unit 840 filters the phase signal OUT to generate the filtering signal FIL means that the filtering signal FIL is generated by removing noise from the phase signal OUT. The filtering unit 840 may be a low pass filter or a moving average filter explained above with reference to FIG. 3.

The delay value of the delay unit 810 may be increased or decreased by a unit delay value controlled by the control unit 860. The unit delay value corresponds to a minimum amount that a delay can be adjusted in a particular embodiment. The delay unit 810 includes a plurality of unit delay cells (not shown in FIG. 8) and the input clock ICLK is delayed while passing through the unit delay cells enabled by the control unit 860. At this time, the delay value of one unit delay cell corresponds to the unit delay value.

The feedback delay unit 870 delays the feedback clock FBCLK to generate the feedback delay clock FBCLKD. The feedback delay unit 870 may include one or more unit delay cells. When the number of the unit delay cells is N, the feedback delay clock FBCLKD is generated by delaying the feedback clock FBCLK by N times the unit delay value. The following description will be given on the case in which the feedback delay unit 870 generates the feedback delay clock FBCLKD by delaying the feedback clock FBCLK by the unit delay value.

The locking unit 850 activates the locking signal LOCK when the filtering signal FIL changes and then maintains the same value two or more times. In the case in which the feedback delay clock FBCLKD is generated by delaying the feedback clock FBCLK by the unit delay value, the locking signal LOCK should be activated when the filtering signal FIL maintains the same value two times and then changes (the reason for this will be described hereinafter with reference to FIG. 9). For reference, in the case in which the feedback delay clock FBCLKD is generated by delaying the feedback clock FBCLK by the unit delay value, the locking signal FIL is activated when the filtering signal FIL changes and then maintains the same value (N+1) or more times.

The configuration of FIG. 8 is substantially identical to that of FIGS. 2 and 4B, except that the filtering signal FIL does not represent the phase relationship between the input signal ICLK and the feedback clock FBCLK, but rather, represents the phase relationship between the input clock ICLK and the feedback delay clock FBCLKD. In addition, another difference is that the combination signal X is activated when FIL_N−2, FIL_N−1, and FIL_N are L, H, and H, respectively. That is, the locking unit 850 activates the locking signal LOCK when FIL_N−2, FIL_N−1, and FIL_N are L, H, and H, respectively.

Through the configuration of FIG. 4B, it can be seen that the locking signal LOCK is activated when the filtering signal FIL changes from 'L' to 'H' and maintains 'H' two times. Since the configuration of activating the locking signal LOCK when the filtering signal FIL changes from 'H' to 'L' and then maintains 'L' two times can be derived from the configuration of FIG. 4B, for the sake of convenience, its detailed description will be omitted.

Figure 9:
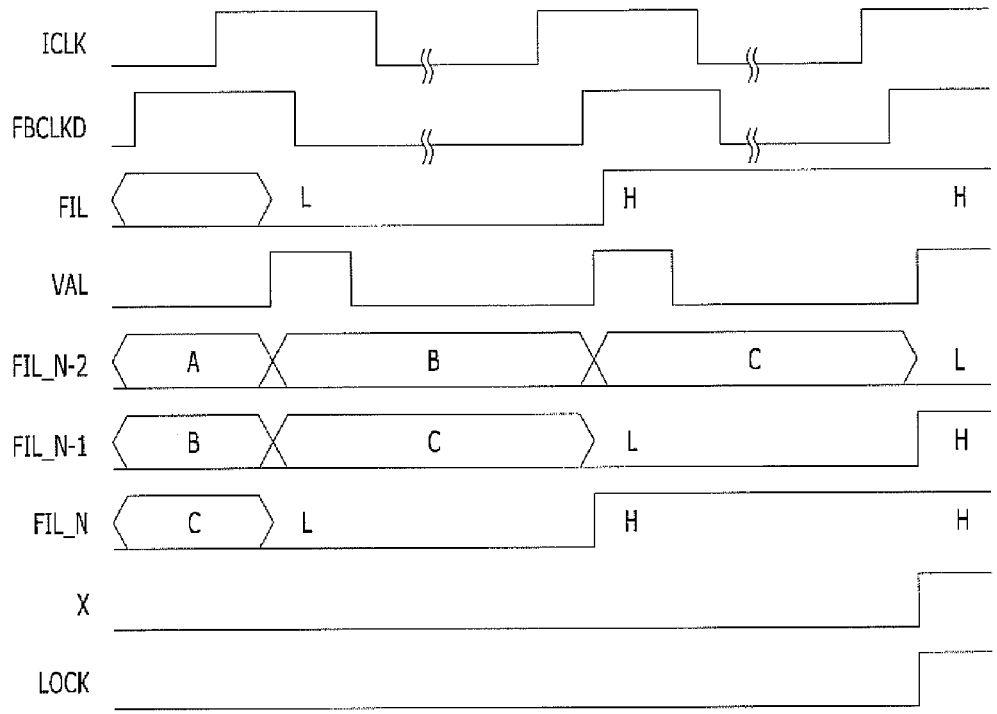
FIG. 9 is a waveform diagram illustrating an operation of a locking unit shown in FIG. 8.

FIG. 9 is a waveform diagram illustrating the operation of the locking unit 850 of FIG. 8.

Referring to FIG. 9, the filtering signal FIL is updated by comparing a phase of the input clock ICLK with a phase of the feedback delay clock FBCLKD, and the validity signal VAL is activated whenever the filtering signal FIL is updated. In FIG. 9, the phase of the feedback delay clock FBCLKD lags behind the phase of the feedback clock FBCLK by a unit delay value. Therefore, the point of time when the value of the filtering signal FIL changes occurs earlier as compared to the case of FIG. 5. To activate the locking signal LOCK at the same point of time as that in FIG. 5, the locking signal FIL is activated when FIL_N−2, FIL_N−1, and FIL_N are L, H, and H, respectively. At this time, the input clock ICLK and the feedback clock FBCLK may be considered as being synchronized with each other.

Likewise, in the case in which the phase of the feedback delay clock FBCLKD lags behind the phase of the feedback clock FBCLK by N times the unit delay value, the transition time occurs earlier accordingly. Considering this, the locking signal LOCK should be activated when the filtering signal FIL changes from 'L' to 'H' and then maintains 'H' N times.

Figure 10:
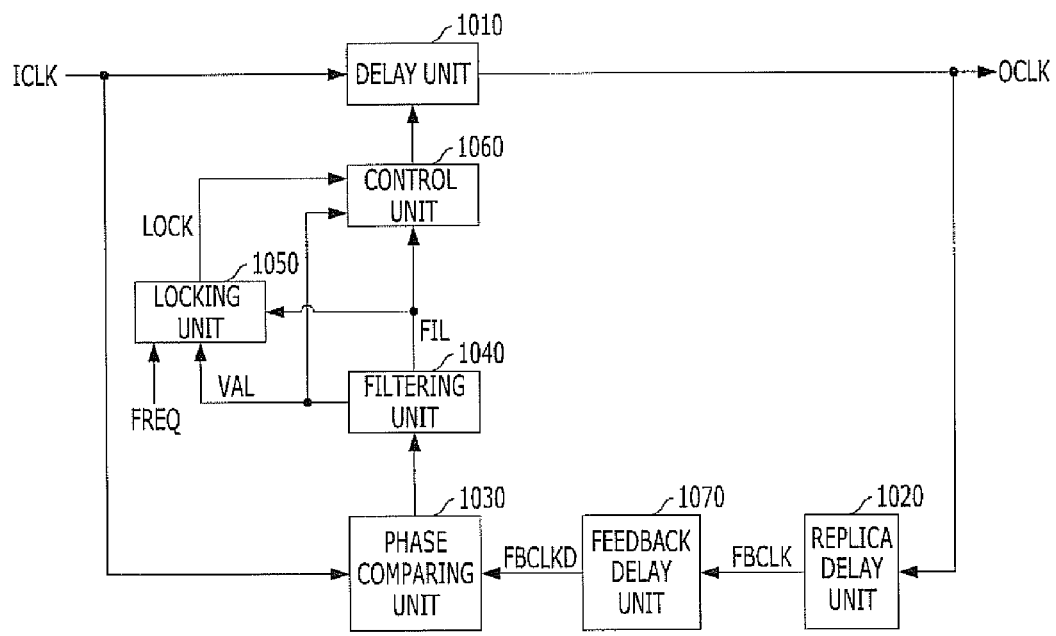
FIG. 10 is a block diagram of a DLL in accordance with still another exemplary embodiment of the present invention.

FIG. 10 is a configuration diagram of a DLL in accordance with still another exemplary embodiment of the present invention.

The DLL shown in FIG. 10 performs a DLL operation by using an input clock ICLK and a feedback delay clock FBCLKD generated by delaying a feedback clock FBCLK. The DLL shown in FIG. 10 increases the reliability of the DLL operation by performing the DLL operation differently according to frequency just like in the DLL shown in FIG. 6.

Referring to FIG. 10, the DLL includes a delay unit 1010, a replica delay unit 1020, a phase comparing unit 1030, a filtering unit 1040, a locking unit 1050, and a control unit 1060.

The delay unit 1010 delays an input clock ICLK to generate an output clock OCLK. The replica delay unit 1020 delays the output clock OCLK to generate a feedback clock FBCLK. The phase comparing unit 1030 outputs a phase signal OUT having a first value when the phase of the feedback delay clock FBCLKD generated by delaying the feedback clock FBCLK leads the phase of the input clock ICLK and having a second value when the phase of the feedback delay clock FBCLKD lags behind the phase of the input clock ICLK. The filtering unit 1040 filters the phase signal OUT to generate a filtering signal FIL. The locking unit 1050 generates a locking signal LOCK in response to the filtering signal FIL. Specifically, the locking unit 1050 generates the locking signal LOCK using different methods in a high speed mode and a low speed mode. The control unit 1060 adjusts the delay value of the delay unit 1010 in response to the filtering signal FIL and maintains the delay value of the delay unit 1010 when the locking signal LOCK is activated.

Hereinafter, an operation of the DLL will be described with reference to FIG. 10.

The DLL of FIG. 10 operates in the substantially same manner as the DLL in FIG. 6, except that the phase relationship between the input clock ICLK and the feedback delay clock FBCLKD is used for activating the locking signal LOCK. The description about the filtering unit 1040 is substantially identical to that described above with reference to FIG. 8.

The operation of the DLL shown in FIG. 10 will be described focusing on the difference between the DLL shown in FIG. 6 and the DLL shown in FIG. 10, based on two cases: the first case in which the DLL in FIG. 10 operates in the high speed mode, and the second case in which in which the DLL in FIG. 10 operates in the low speed mode.

(1) High speed mode operation (which is substantially identical to the first method of FIG. 2, identical to the high speed mode explained above with reference to FIG. 6, in which the frequency signal FREQ is activated)

The locking unit 1050 activates the locking signal FIL when the filtering signal FIL changes from 'L' to 'H' or from 'H' to U. The conditions and configuration of the locking unit 1050 for activating the filtering signal FIL are substantially identical to those explained above with reference to FIGS. 2 and 4A.

(2) Low speed mode operation (which is substantially identical to the second method of FIG. 2, identical to the low speed mode explained above with reference to FIG. 6, in which the frequency signal FREQ is deactivated)

The locking unit 1050 activates the locking signal LOCK when the filtering signal FIL changes from 'L' to 'H' and then maintains 'H' two or more times, or changes from 'H' to 'L' and maintains 'L' two or more times. The conditions and configuration of the locking unit 1050 for activating the filtering signal FIL are substantially identical to those explained above with reference to FIG. 8.

Figure 11:
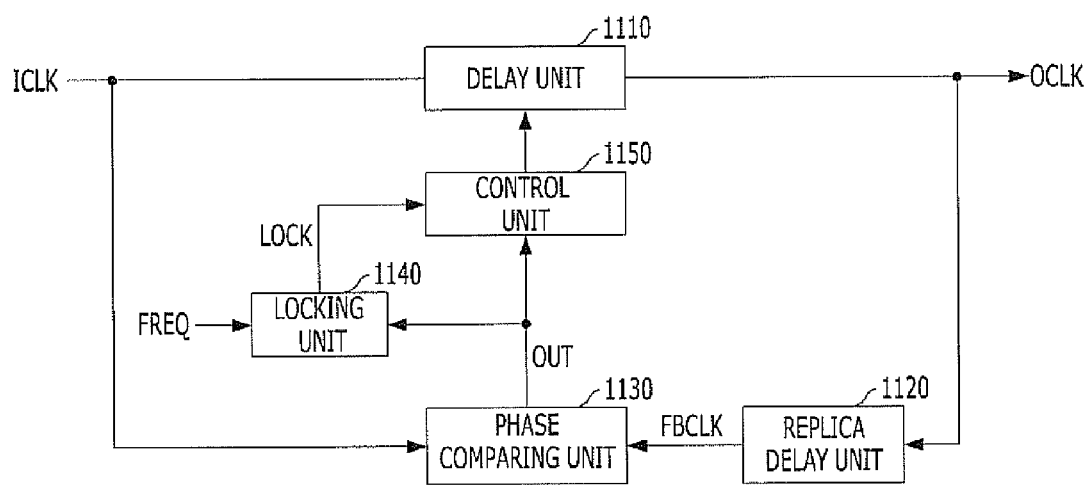
FIG. 11 is a block diagram of a DLL in accordance with still another exemplary embodiment of the present invention.

FIG. 11 is a block diagram of a DLL in accordance with still another exemplary embodiment of the present invention.

The DLL in FIG. 11 performs a DLL operation by using a phase signal OUT, instead of a filtering signal FIL. The DLL in FIG. 11 increases the reliability of the DLL operation by performing the DLL operation differently according to frequency just like the DLL in FIG. 6.

Referring to FIG. 11, the DLL includes a delay unit 1110, a replica delay unit 1120, a phase comparing unit 1130, a locking unit 1140, and a control unit 1150. The delay unit 1110 delays an input clock ICLK to generate an output clock OCLK. The replica delay unit 1120 delays the output clock OCLK to generate a feedback clock FBCLK. The phase comparing unit 1130 outputs a phase signal OUT having a first value when the phase of the feedback clock FBCLK leads the phase of the input clock ICLK and having a second value when the phase of the feedback clock FBCLK lags behind the phase of the input clock ICLK. The locking unit 1140 generates a locking signal LOCK in response to the filtering signal FIL. Specifically, the locking unit 1140 generates the locking signal LOCK using different methods in a high speed mode and a low speed mode. The control unit 1150 adjusts the delay value of the delay unit 1110 in response to the phase signal OUT and maintains the delay value of the delay unit 1110 when the locking signal LOCK is activated.

The DLL in FIG. 11 performs the DLL operation without using the filtering signal FIL. Thus, the DLL in FIG. 11 is substantially identical to the DLL of FIG. 6, except that the filtering unit 650 in FIG. 6 is not used and the locking signal LOCK is activated using the phase signal OUT instead of the filtering signal FIL.

In accordance with exemplary embodiments of the present invention, the DLL filters the output of the phase comparing unit by using the moving average filter, stores the phase comparing result, and performs the DLL operation using the stored value, thereby potentially reducing the occurrence of a malfunction.

While the present invention has been described with respect to the specific embodiments, it will be apparent to those skilled in the art that various changes and modifications may be made without departing from the spirit and scope of the invention as defined in the following claims.

What is claimed is:

1. A delay locked loop comprising:
   a delay unit configured to delay an input clock to generate an output clock;
   a replica delay unit configured to delay the output clock to generate a feedback clock;
   a phase comparing unit configured to output a phase signal having a first value when a phase of the feedback clock leads a phase of the input clock and having a second value when the phase of the feedback clock lags behind the phase of the input clock;
   a filtering unit configured to generate a filtering signal in response to the phase signal and update the filtering signal when a difference between a count number of the phase signal having the first value and a count number of the phase signal having the second value is substantially equal to a filtering depth;
   a locking unit configured to generate a locking signal in response to the filtering signal; and
   a control unit configured to adjust a delay value of the delay unit in response to the filtering signal and maintain the delay value of the delay unit when the locking signal is activated.

2. The delay locked loop of claim 1, wherein the filtering unit generates a validity signal when the difference between the count number of the phase signal having the first value and the count number of the phase signal having the second value is substantially equal to the filtering depth.

3. The delay locked loop of claim 2, wherein the locking unit is enabled in response to the validity signal.

4. The delay locked loop of claim 3, wherein the locking unit activates the locking signal when the logic value of the filtering signal transits.

5. The delay locked loop of claim 3, wherein the locking unit activates the locking signal when the logic value of the filtering signal transits after maintaining the same value two or more times.

6. The delay locked loop of claim 1, wherein, when the validity signal is activated, the control unit increases the delay value of the delay unit if the filtering signal represents that the phase of the feedback clock leads the phase of the input clock, and decreases the delay value of the delay unit when the filtering signal represents that the phase of the feedback clock lags behind the phase of the input clock.

7. The delay locked loop of claim 3, wherein the locking unit comprises:
   a first logic device configured to output an activation signal when the validity signal is activated; and
   a second logic device configured to output a first logic value as the locking signal in response to the filtering signal and the activation signal.

8. The delay locked loop of claim 5, wherein the locking unit comprises:
   a first logic device configured to output an activation signal when the validity signal is activated;
   a storage unit configured to store a predetermined number of filtering signals in series and output the filtering signals in parallel;
   a combining unit configured to logically combine the filtering signal and generate a combined filtering signal; and
   a second logic device configured to output a first logic value as the locking signal in response to the combined filtering signal and the activation signal.

9. The delay locked loop of claim 1, wherein the locking unit is configured to generate a locking signal in response to the filtering signal by using different methods in a high speed mode and a low speed mode.

10. The delay locked loop of claim 9, wherein, in the high speed mode in which a frequency of the input clock is high, the locking unit activates the locking signal when the logic value of the filtering signal transits, and,
    in the low speed mode in which the frequency of the input clock is low, the locking unit activates the locking signal when the filtering signal maintains the same logic value two or more times and transits.

11. A delay locked loop comprising:
    a delay unit configured to delay an input clock to generate an output clock;
    a replica delay unit configured to delay the output clock to generate a feedback clock;
    a feedback delay unit configured to delay the feedback clock and generate a feedback delay clock;
    a phase comparing unit configured to output a phase signal having a first value when a phase of the feedback delay clock leads a phase of the input clock and having a second value when the phase of the feedback delay clock lags behind the phase of the input clock;
    a filtering unit configured to filter the phase signal to generate a filtering signal;
    a locking unit configured to generate a locking signal in response to the filtering signal; and
    a control unit configured to adjust a delay value of the delay unit in response to the filtering signal, and maintain the delay value of the delay unit when the locking signal is activated.

12. The delay locked loop of claim 11, wherein the filtering unit generates the filtering signal in response to the phase signal, and updates the filtering signal when a difference between a count number of the phase signal having the first value and a count number of the phase signal having the second value is substantially equal to the filtering depth.

13. The delay locked loop of claim 12, wherein the locking unit activates the locking signal when the logic value of the filtering signal transits and maintains the same logic value two or more times.

14. The delay locked loop of claim 12, wherein the delay value of the delay unit is increased or decreased by a unit delay value.

15. The delay locked loop of claim 14, wherein the feedback delay clock is generated by delaying the feedback clock by N times the unit delay value, N being a positive integer.

16. The delay locked loop of claim 15, wherein the locking unit activates the locking signal when the logic value of the filtering signal transits and maintains the same logic value (N+1) or more times.

17. The delay locked loop of claim 11, wherein the locking unit is configured to generate a locking signal in response to the filtering signal by using different methods in a high speed mode and a low speed mode.

18. The delay locked loop of claim 17, wherein, in the high speed mode in which a frequency of the input clock is high, the locking unit activates the locking signal when the filtering signal transits, and in the low speed mode in which the frequency of the input clock is low, the locking unit activates the locking signal when the logic value of the filtering signal transits and maintains the same value two or more times.

19. A delay locked loop comprising:
a delay unit configured to delay an input clock to generate an output clock;
a replica delay unit configured to delay the output clock to generate a feedback clock;
a phase comparing unit configured to output a phase signal having a first value when a phase of the feedback clock leads a phase of the input clock and having a second value when the phase of the feedback clock lags behind the phase of the input clock;
a locking unit configured to generate a locking signal in response to the phase signal by using different methods in a high speed mode and a low speed mode; and
a control unit configured to adjust a delay value of the delay unit in response to the phase signal, and maintain the delay value of the delay unit when the locking signal is activated.

20. The delay locked loop of claim 19, wherein, in the high speed mode, the locking unit activates the locking signal when the logic value of the phase signal transits, and, in the low speed mode, the locking unit stores a value of the phase signal and activates the locking signal when the logic value of the phase signal maintains the same value two or more times and transits.

* * * * *